United States Patent [19]

Dhillon

[11] Patent Number: 4,822,723
[45] Date of Patent: Apr. 18, 1989

[54] DEVELOPER COMPOSITIONS FOR HEAVY-DUTY LITHOGRAPHIC PRINTING PLATES

[75] Inventor: Major S. Dhillon, Belle Mead, N.J.

[73] Assignee: Hoechst Celanese Corporation, Somerville, N.J.

[21] Appl. No.: 126,147

[22] Filed: Nov. 30, 1987

[51] Int. Cl.$^4$ .................................................. G03C 5/18
[52] U.S. Cl. ..................................... 430/331; 430/302; 430/309; 252/145; 252/158; 252/170; 252/174.19
[58] Field of Search ....................... 430/302, 309, 331; 252/170, 143, 158, 174.19

[56] References Cited

U.S. PATENT DOCUMENTS

| | | | |
|---|---|---|---|
| 3,891,439 | 6/1975 | Katz et al. | 430/331 |
| 4,186,006 | 1/1980 | Kobayashi et al. | 430/302 |
| 4,391,897 | 7/1983 | Gracia et al. | 430/302 |
| 4,396,703 | 8/1983 | Matsumoto et al. | 430/309 |
| 4,416,976 | 11/1983 | Schell | 430/331 |
| 4,419,265 | 12/1983 | Diery et al. | 252/331 |
| 4,592,992 | 6/1986 | Hsieh et al. | 430/309 |
| 4,714,670 | 12/1987 | Amariti et al. | 430/331 |
| 4,716,098 | 12/1987 | Mack et al. | 430/302 |
| 4,728,597 | 3/1988 | Hsieh et al. | 430/331 |

FOREIGN PATENT DOCUMENTS 1057105 6/1979 Canada .
2184689 7/1987 United Kingdom .

*Primary Examiner*—Paul R. Michl
*Assistant Examiner*—Patrick Doody
*Attorney, Agent, or Firm*—Richard S. Roberts

[57] ABSTRACT

A developer composition for heavy duty printing plates which comprises in admixture:
 (a) propylene glycol monomethyl ether or dipropylene glycol monomethyl ether; and
 (b) benzyl alcohol and/or phenoxyethanol; and
 (c) ethylene carbonate and/or propylene carbonate; and
 (d) ethylene glycol diacetate; and
 (e) sodium benzoate and/or lithium benzoate; and
 (f) benzoic acid and/or citric acid; and
 (g) ethylene glycol, propylene glycol and/or glycerin; and
 (h) sufficient water to formulate an effective developer;

wherein the percentages are based on the weight of the developer composition.

23 Claims, No Drawings

DEVELOPER COMPOSITIONS FOR HEAVY-DUTY LITHOGRAPHIC PRINTING PLATES

BACKGROUND OF THE INVENTION

This invention relates to a developing system for photosensitive coatings on substrates, particularly diazo-sensitized photosensitive coatings on substrates, e.g., lithographic printing plates, and more particularly to compositions for developing an exposed lithographic plate to remove non-image areas and to prepare the plate for press.

Lithographic printing utilizes the immiscibility between oleophilic inks and an aqueous dampening fluid on a substantially planar printing plate surface. An oleophilic image area that corresponds to an image to be printed is formed on a plate, and the remainder of the plate surface, the non-image area, is or is made hydrophilic in character. The image area accepts greasy ink and transfers the ink during printing; the non-image area is kept damp with water or an aqueous dampening fluid and repels the ink so that no printing occurs from that area. To form such a printing plate, a flat base surface is coated with a very thin layer of a light-sensitive material and exposed to light through a transparent film having opaque areas. A negative transparency of the image desired to be reproduced is used for exposing a so-called negative-acting plate, and a positive transparency is used for exposing a so-called positive-acting plate. Light passes through the clear areas of the negative transparency, which correspond to the image, and causes a reaction in the light-sensitive coating on the underlying plate that "hardens" the coating in the image area. Light does not pass through the opaque areas of the transparency, however, so that the light-sensitive coating on the plate underlying such areas remains unaffected. The plate is then developed by removing the coating from the plate in unexposed areas, which are hydrophilic, or are then made hydrophilic.

In the past, negative working diazo-sensitized lithographic plates have generally been developed with solvents. Some of the solvents used have been isopropyl alcohol, normal propyl alcohol, Cellosolve (ethylene glycol monoethyl ether), butyl alcohol, benzyl alcohol, etc. Some developers consist essentially of organic solvents whereas others contain water in addition to the organic solvents. In either the organic solvent type or the aqueous type, aromatic sulfonic acids or their sodium salts have been used. These developers have suffered from one or more disadvantages when used to develop negative working diazo-sensitized lithographic plates. For example, a mixture of 20 percent normal propyl alcohol and 80 percent water, when used to develop lithographic plates, has a tendency to overdevelop the plates because of narrow solubility differential between image and non-image areas.

Sulfonic acids have been used in developers, but they have several disadvantages. They are more corrosive than the amphoteric surfactants of this invention and when used in a developing machine will tend to corrode its bearings, piping and other metallic parts. Perhaps because of this corrosive nature and its effect on image areas, plates developed with developers containing sulfonic acids do not print as many copies as those developed with the developers of this invention. Surfactant-type wetting agents are preferred in many formulations. Sulfonic acids, e.g., 2-hydroxy-4-methoxybenzophenone-5-sulfonic acid, tend to decompose and precipitate surfactant-type wetting agents in developer compositions. Those same wetting agents result in undesirable foaming when used in developing machines. The aforementioned sulfonic acid is an ultraviolet light absorber; and as it absorbs, it discolors. Consequently, an actinic-absorbing material must be used as the material for bottles containing it.

Developers containing sodium salts of sulfonic acids and solvents such as glycols instead of surfactant-type wetting agents were found to leave a dirty background when used to machine-develop plates. To clean the background it was necessary to increase the concentration of the sodium salt of the sulfonic acid, but that resulted in a grey scale decreased by about 2 steps, i.e., the dots in the half-tone on the plate were smaller than in the transparency used in exposing it.

The newspaper market uses lacquers for developing wipe-on and presensitized plates. Most of the commercially available lacquers contain considerable quantities of malodorous and toxic solvents. As a prerequisite for any newsplate developer, it must be able to be used in existing lacquer type developing machinery and it must be capable of adequately removing the non-image area of the plate. This invention has as an object, the reduction of the odor associated with heavy duty newsplate developers. Naturally it is most desirable to have a developer composition which is capable of completing development in a short period of time. The oleophilic image areas of the printing plate should be ink receptive and water repellant whereas the hydrophilic non-image areas should be water receptive and greasy ink repellant. The proper selection of the solvent in a developer solution is very important. If the selected solvent in a developer solution is a good solvent for the light sensitive composition itself, the solvent will not satisfactorily distinguish between the exposed areas and the unexposed areas. As a result, a large portion of the image area coating is dissolved in the solvent or is severely swollen and removed. Such printing plates have no practical value. By the addition of a large amount of water to reduce the concentration of the organic solvent in the developer solution, image differentiation can be improved. However, during the development of a printing plate, particularly in negative working plates, non-image areas comprising resin binders such as acetals, and particularly polyvinyl formal, solvate in the developer solution and separate from the support and contract to spherical shapes in a highly tacky condition. Such solvated particles deposit upon still-solvent-wet image areas and adhere permanently even after drying. Not only are these "redeposited" areas visible to the naked eye on the developed printing plate but are removed by tacky ink during printing which pulls away the true underimage, leaving skips which show as absence of image on the printed sheet.

Lithographic printing plates generally are composed of an aluminum containing subs:rate which may or may not have been treated with a variety of processes recognized in the art process including anodization, graining and hydrophilization. The thusly prepared substrate may then be applied with a photosensitive coating comprising a photosensitizer, binding resins, colorants, acid stabilizers, surfactants and other art recognized components. Common photosensitizers include diazo compounds, including polymeric diazonium condensates salts and photopolymerizable compositions. Sensitizers, binders and printing plates employing aromatic diazonium compounds are described in U.S. Pat. Nos. 3,175,906; 3,046,118; 2,063,631; 2,667,415, 3,867,147 and 3,679,419. Typical prior art developing compositions are described in U.S. Pat. Nos. 2,754,279; 4,381,340 and German OLS No. 2,216,419.

It is an object of this invention to provide an improved developing system for lithographic printing plates. A more particular object of this invention is to provide an improved developer composition for removing non-image areas from lithographic printing plates on which the light-sensitive agent in the coating thereon is a substantially water-insoluble diazonium compound, and which developer has a reduced odor.

SUMMARY OF THE INVENTION

The invention provides a developer composition which comprises in admixture
- (a) from about 25.0% to about 75.0% of one or more components selected from the group consisting of propylene glycol monomethyl ether and dipropylene glycol monomethyl ether., and
- (b) from about 0.5% to about 10.0% of one or more components selected from the group consisting of benzyl alcohol and phenoxyethanol., and
- (c) from about 0.05% to about 5.0% of one or more components selected from the group consisting of ethylene carbonate and propylene carbonate; and
- (d) from about 1.0% to about 30.0% ethylene glycol diacetate; and
- (e) from about 0.1% to about 10.0% of one or more components selected from the group consisting of sodium benzoate and lithium benzoate; and
- (f) from about 0.05% to about 5.0% of one or more components selected from the group consisting of benzoic acid and citric acid., and
- (g) from about 1% to about 35% of one or more components selected from the group consisting of ethylene glycol, propylene glycol and glycerin; and
- (h) sufficient water to formulate an effective developer;

wherein said percentages are based on the weight of the developer composition.

The invention further provides a method for preparing a photographic element which comprises imagewise exposing a photographic element comprising a light sensitive negative working or positive working photographic composition disposed on a substrate with sufficient actinic radiation to form a latent image and then removing the non-image areas of said exposed element with a developer composition which comprises in admixture:
- (a) from about 25.0% to about 75.0% of one or more components selected from the group consisting of propylene glycol monomethyl ether and dipropylene glycol monomethyl ether; and
- (b) from about 0.5% to about 10.0% of one or more components selected from the group consisting of benzyl alcohol and phenoxyethanol; and
- (c) from about 0.05% to about 5.0% of one or more components selected from the group consisting of ethylene carbonate and propylene carbonate; and
- (d) from about 1.0% to about 30.0% ethylene glycol diacetate; and
- (e) from about 0.1% to about 10.0% of one or more components selected from the group consisting of sodium benzoate and lithium benzoate; and
- (f) from about 0.05% to about 5.0% of one or more components selected from the group consisting of benzoic acid and citric acid; and
- (g) from about 1% to about 35% of one or more components selected from the group consisting of ethylene glycol, propylene glycol and glycerin, and
- (h) sufficient water to formulate an effective developer;

wherein said percentages are based on the weight of the developer composition.

DETAILED DESCRIPTION OF THE PREFERRED EMBODIMENT

As the first step in the production of negative working photographic elements such as lithographic printing plates, a sheet substrate such as aluminum compositions suitable for the manufacture of lithographic printing plates such as, Alcoa 3003 and Alcoa 1100, which may or may not have been pretreated by standard graining and/or etching and/or anodizing techniques as are well known in the art, and also may or may not have been treated with a composition, such as polyvinyl phosphonic acid, suitable for use as a hydrophilizing layer for lithographic plates is coated with a light sensitive polymeric diazonium salt or photopolymer containing composition. Such compositions may also contain binding resins, such as polyvinyl formal resins, colorants, acid stabilizers, surfactants, exposure indicators or other art recognized ingredients. The photosensitive sheet material is then exposed to a suitable radiation source through a mask or transparency, and the exposed sheet then developed for removal of the non-image photosensitive materials. The photosensitive coating mixture is usually prepared in a solvent composition which is compatible with all the other composition ingredients. The light sensitive composition is then coated on the substrate and the solvent dried off.

Diazonium compounds most commonly employed in the preparation of light sensitive compositions suitable for the present application may be characterized by the generic structure $A-N_2+X$, wherein A is an aromatic or heterocylic residue and X is the anion of an acid. Specific examples of light sensitive diazonium materials useful as aforementioned include higher molecular weight compositions obtained, for example, by the condensation of certain aromatic diazonium salts in an acid condensation of certain aromatic carbonyl compounds such as formaldehyde, as disclosed for example in U.S. Pat. Nos. 2,063,631 and 2,667,415. A preferred class of diazonium compounds is described in U.S. Pat. No. 3,849,392. All of the foregoing patents are incorporated herein by reference. A most preferred diazonium salt is the polycondensation product of 3-methoxy-4-diazodiphenyl amine sulfate and 4,4'-bis-methoxy methyldiphenyl ether, precipitated as the mesitylene sulfonate, as taught in U.S. Pat. No. 3,849,392. Suitable photopolymerizable compositions and quinone diazide compositions are also well known to the skilled artisan.

The present invention provides a method for developing such exposed photosensitive elements by contacting them, to remove the non-image areas, using a developer which contains the aforementioned ingredients in aqueous mixture.

The developr contains a propylene glycol monomethyl ether or dipropylene glycol monomethyl ether component. In the preferred embodiment this component is present in an amount of from about 25.0% to about 75.0% by weight of the developer. A more preferred range is from about 35.0% to about 65.0% and most preferably from about 45.0% to about 55.0%.

The developer also contains from about 0.05% to about 5.0% by weight of the developer of ethylene carbonate or propylene carbonate. A more preferred range is from about 0.1% to about 1.0% and most preferably from about 0.3% to about 0.7%.

The developer further contains from about 1.0% to about 30.0% by weight of the developer of ethylene glycol diacetate. A more preferred range is from about 5.0% to about 20.0% and most preferably from about 10.0% to about 15.0%.

The developer also contains from about 0.1% to about 10.0% based on the weight of the developer of sodium or lithium benzoate. A more preferred range is from about 0.5% to about 3.0% and most preferably from about 0.7% to about 1.3%.

The developer further contains from about 1.0% to about 35% of one or more of ethylene glycol, propylene glycol and glycerin. A more preferred range is from about 5.0% to about 20.0% and most preferably from about 10.0% to about 13.0%, all based on the weight of the developer. In one preferred embodiment this component is a mixture of glycerin and ethylene glycol in a relative ratio of about 1:15 to about 200:1.

The developer contains 0.05% to about 5.0% based on the weight of the developer of benzoic or citric acid. A more preferred range is from about 0.1% to about 1.0% and most preferably from about 0.4% to about 0.6%.

The developer contains from about 0.5% to about 10.0% based on the weight of the developer of benzyl alcohol or phenoxyethanol. A more preferred range is from about 1.0% to about 5.0% and most preferably from about 2.0% to about 4.0%. In the preferred embodiment, the developer of the present invention preferably contains optional minor amounts of a conventional antifoam component which aids in processing of the printing plate. This component, when it is used is preferably present in an amount of from about 0.005% to about 0.075% by weight of the developer. A more preferred range is from about 0.01% to about 0.05% and most preferably from about 0.02% to about 0.04%. One preferred antifoam agent is Dow DB-100 which is a silicone type antifoam. The developer may also contain optional film formers. The developer also contains sufficient water in order to formulate an effective developer. In the preferred embodiment the balance of the developer is only water. The developer is capable of substantially completely removing the non-image areas of a photographic element in about 2 minutes or less while simultaneously removing substantially none of the image areas. Substantially none of the material comprising said non-image areas is re-deposited back onto said photographic element. The following non-limiting examples serve to illustrate the invention.

EXAMPLE 1

ENCO ® presensitized Newsplate S plates are imagewise exposed to 230 mJ/cm$^2$. The developer compartment of a National Processor is charged with the following developer:

| Ingredients | Weight Percent |
| --- | --- |
| Water | 20.00 |
| Glycerin | 10.00 |
| Propylene glycol monomethyl ether | 50.00 |
| Benzyl alcohol | 3.00 |
| Ethylene glycol | 1.50 |
| Ethylene glycol diacetate | 13.50 |
| Ethylene carbonate | 0.50 |
| Sodium benzoate | 1.00 |
| Benzoic acid | 0.50 |

ENCO Subtractive Finisher is used in the finisher section of the Processor. The exposed plates are passed through the processor at plate throughtput speeds of 3,4 and 5 feet per minute. The developer and finisher flow rates are set at 6 and 4, respectively. The plates developed at throughput speeds of 3,4 and 5 feet per minute have acceptable lithographic properties. No piling, plugging or redepsoit is observed in these developed plates.

As a comparison, Newplates S plates developed with Graphex Lacquer (available from Graphex litho System of Milwaukee, WI 53214) using the same processor parameters is used as a control. The lithographic properties are given below:

| Lithographic Property | This Developer | Comparative Lacquer |
| --- | --- | --- |
| Solid/ghost on a 21 step Stouffer Resolution: | 5/9 | 7/9 |
| UGRA Circle (microns) | 8-12 | 12-15 |
| UGRA 150 lines per inch | 2-98% | 1-97% |
| Impressions to Roll-up | 15 ± 5 | 30 ± 5 |
| Length of Run (abrasive conditions) | 220M | 75M |
| Redeposit | None | Yes |
| Odor | Strong | Weak |

The experimental developer had the following advantages over the comparative lacquer:
1. Less odor
2. No redeposit tendency
3. Better resolution
4. Faster roll-up
5. Longer length of run

| Ingredients | Weight Percent |
| --- | --- |
| Water | 30.0 |
| Propylene glycol monomethyl ether | 45.0 |
| Phenoxyethanol | 5.0 |
| Ethylene glycol | 3.0 |
| Ethylene glycol diacetate | 13.0 |
| Ethylene carbonate | 2.0 |
| Sodium benzoate | 1.5 |
| Benzoic acid | 0.5 |

| Ingredients | Weight Percent |
| --- | --- |
| Water | 30.0 |
| Glycerin | 3.0 |
| Propylene glycol monomethyl ether | 45.0 |
| Phenoxypropanol | 5.0 |
| Ethylene glycol diacetate | 13.5 |
| Ethylene carbonate | 1.5 |
| Lithium benzoate | 1.5 |
| Benzoic acid | 0.5 |

| Ingredients | Weight Percent |
| --- | --- |
| Water | 25.0 |
| Glycerin | 8.0 |
| Propylene glycol monomethyl ether | 45.0 |
| gamma-Butyrolactone | 3.0 |
| Benzyl alcohol | 2.0 |
| Ethylene glycol | 1.0 |
| Ethylene glycol diacetate | 13.0 |
| Ethylene carbonate | 1.0 |
| Sodium benzoate | 1.5 |
| Benzoic acid | 0.5 |

The developers of examples 2 to 5 are evaluated by the procedure illustrated in Example 1. The Newsplate S plates developed by the developers of Examples 2 to 5 give similar lithographic properties as obtained with the developer of Example 1.

What is claimed is:

1. A developer composition which comprises in admixture:
   (a) from about 25.0% to about 75.0% of one or more components selected from the group consisting of propylene glycol monomethyl ether and dipropylene glycol monomethyl ether; and
   (b) from about 0.5% to about 10.0% of one or more components selected from the group consisting of benzyl alcohol, phenoxypropanol and phenoxyethanol; and
   (c) from about 0.05% to about 5.0% of one or more components selected from the group consisting of ethylene carbonate and propylene carbonate; and
   (d) from about 1.0% to about 30.0% ethylene glycol diacetate; and
   (e) from about 0.1% to about 10.0% of one or more components selected from the group consisting of sodium benzoate and lithium benzoate, and
   (f) from about 0.05% to about 5.0% of one or more components selected from the group consisting of benzoic acid and citric acid; and
   (g) from about 1% to about 35% of one or more components selected from the group consisting of ethylene glycol, propylene glycol and glycerin, and
   (h) sufficient water to formulate an effective developer;
   wherein said percentages are based on the weight of the developer composition.

2. The developer of claim 1 wherein component (a) comprises propylene glycol monomethyl ether.

3. The developer of claim 1 wherein component (b) comprises benzyl alcohol.

4. The developer of claim 1 wherein component (c) comprises ethylene carbonate.

5. The developer of claim 1 wherein component (e) comprises sodium benzoate acid.

6. The developer of claim 1 wherein said component (f) comprises benzoic acid.

7. The developer of claim 2 wherein said component (g) comprises an admixture of glycerin and ethylene glycol.

8. The developer of claim 1 wherein component (a) is present in an amount of from about 45.0% to about 55.0% based on the weight of the developer composition.

9. The developer of claim 1 wherein component (b) is present in an amount of from about 2.0% to about 4.0% based on the weight of the developer composition.

10. The developer of claim 1 wherein component (c) is present in an amount of from about 0.3% to about 0.7% based on the weight of the developer composition.

11. The developer of claim 1 wherein said component (d) is present in an amount of from about 10.0% to about 15.0% based on the weight of the developer composition.

12. The developer of claim 1 wherein component (e) is present in an amount of from about 0.7% to about 1.3% based on the weight of the developer composition.

13. The developer of claim 1 wherein component (f) is present in an amount of from about 0.4% to about 0.6% based on the weight of the developer composition.

14. The developer of claim 1 wherein component (g) is present in an amount of from about 10.0% and about 13.0%.

15. The developer of claim 1 wherein said component (a) comprises propylene glycol monomethyl ether and is present in an amount of from 45.0% to about 55.0% component (b) comprises benzyl alcohol and is present in an amount of from about 2.0% to about 4.0%, component (c) comprises ethylene carbonate and is present in an amount of from about 0.3% to about 0.7%, component (d) is present in an amount of from about 10.0% to about 15.0%, component (e) comprises sodium benzoate and is present in an amount of from about 0.7% to about 1.3% and said component (f) is benzoic acid and is present in an amount of from about 0.4% to about 0.6%; and said component (g) is an admixture of glycerin and ethylene glycol present in an amount of from about 10.0% to about 13.0% and the ratio of glycerin to ethylene glycol ranges from about 1:15 to about 200:1.

16. A method of treating a photographic element which comprises imagewise exposing a positive working or negative working photographic element to sufficient actinic radiation to form a latent image thereon, and then removing the non-image portions thereof with:
   a developer composition which comprises in admixture:
   (a) from about 25.0% to about 75.0% of one or more components selected from the group consisting of propylene glycol monomethyl ether and dipropylene glycol monomethyl ether; and
   (b) from about 0.5% to about 10.0% of one or more components selected from the group consisting of benzyl alcohol, phenoxypropanol and phenoxyethanol; and
   (c) from about 0.05% to about 5.0% of one or more components selected from the group consisting of ethylene carbonate and propylene carbonate., and
   (d) from about 1.0% to about 30.0% ethylene glycol diacetate; and
   (e) from about 0.1% to about 10.0% of one or more components selected from the group consisting of sodium benzoate and lithium benzoate; and
   (f) from about 0.05% to about 5.0% of one or more components selected from the group consisting of benzoic acid and citric acid; and
   (g) from about 1% to about 35% of one or more components selected from the group consisting of ethylene glycol, propylene glycol and glycerin; and
   (h) sufficient water to formulate an effective developer;

wherein said percentages are based on the weight of the developer composition.

17. The method of claim 16 wherein component (a) comprises propylene glycol monomethyl ether.

18. The method of claim 16 wherein component (b) comprises benzyl alcohol.

19. The method of claim 16 wherein component (c) comprises ethylene carbonate.

20. The method of claim 16 wherein component (e) comprises sodium benzoate.

21. The method of claim 16 wherein said component (f) comprises benzoic acid.

22. The method of claim 16 wherein said component (g) comprises an admixture of glycerin and ethylene glycol, and the ratio of glycerin to ethylene glycol ranges from about 1:15 to about 200:1.

23. The method of claim 16 wherein said component (a) comprises propylene glycol monomethyl ether and is present in an amount of from 45.0% to about 55.0%, component (b) comprises benzyl alcohol and is present in an amount of from about 2.0% to about 4.0%, component (c) comprises ethylene carbonate and is present in an amount of from about 0.3% to about 0.7% component (d) is present in an amount of from about 10.0% to about 15.0%, component (e) comprises sodium benzoate and is present in an amount of from about 0.7% to about 1.3% and said component (f) is benzoic acid and is present in an amount of from about 0.4% to about 0.6%; and said component (g) is an admixture of glycerin and ethylene glycol and is present in an amount of from about 10.0% to about 13.0% and the ratio of glycerin to ethylene glycol ranges from about 1:15 to about 200:1.

* * * * *